United States Patent
Hori

(10) Patent No.: US 9,160,379 B2
(45) Date of Patent: Oct. 13, 2015

(54) TRANSMITTER AND TRANSMITTING METHOD

(71) Applicant: Shinichi Hori, Tokyo (JP)

(72) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/380,849

(22) PCT Filed: Feb. 19, 2013

(86) PCT No.: PCT/JP2013/053908
§ 371 (c)(1),
(2) Date: Aug. 25, 2014

(87) PCT Pub. No.: WO2013/140914
PCT Pub. Date: Sep. 26, 2013

(65) Prior Publication Data
US 2015/0049842 A1 Feb. 19, 2015

(30) Foreign Application Priority Data
Mar. 22, 2012 (JP) .................... 2012-066261

(51) Int. Cl.
*H04B 1/04* (2006.01)
*H03F 3/217* (2006.01)
*H03M 3/00* (2006.01)

(52) U.S. Cl.
CPC .............. *H04B 1/0475* (2013.01); *H03F 3/217* (2013.01); *H03M 3/492* (2013.01); *H03F 2200/331* (2013.01); *H03M 3/486* (2013.01); *H04B 2001/045* (2013.01)

(58) Field of Classification Search
USPC .................... 375/297, 300; 330/10
See application file for complete search history.

(56) References Cited

U.S. PATENT DOCUMENTS

| 8,681,898 | B2 * | 3/2014 | Kim et al. ............... 375/302 |
| 2004/0036530 | A1 * | 2/2004 | Matsuura et al. ........... 330/10 |
| 2006/0071835 | A1 * | 4/2006 | Inukai ................... 341/143 |
| 2009/0088096 | A1 * | 4/2009 | Sun et al. ............... 455/127.1 |

(Continued)

FOREIGN PATENT DOCUMENTS

| JP | 64-7437 U | 1/1989 |
| JP | 07-212234 A | 8/1995 |

(Continued)

OTHER PUBLICATIONS

Richard Schreier, et al., "Understanding Delta-Sigma Data Converters," IEEE Press, Nov. 8, 2004, pp. 64, 65, 70, and 71.

(Continued)

*Primary Examiner* — Eva Puente
(74) *Attorney, Agent, or Firm* — Sughrue Mion, PLLC

(57) ABSTRACT

A transmitter according to the present invention includes a level detector that detects the level value of an input signal, from among a predetermined number of level values; an upstream-side signal adjusting unit that amplifies the input signal and shifts the input signal for an offset amount based on an output signal of the level detector; a digital-sigma modulator having a quantizer that quantizes an output signal of the upstream-side signal adjusting unit with a predetermined number of bits, and a downstream-side signal adjusting unit that amplifies an output signal of the delta-sigma modulator and shifts the output signal of the delta-sigma modulator for an offset amount based on the output signal of the level detector.

8 Claims, 10 Drawing Sheets

(56) References Cited

U.S. PATENT DOCUMENTS

| 2012/0027127 | A1* | 2/2012 | Kato | 375/300 |
| 2012/0161864 | A1* | 6/2012 | Lee et al. | 330/10 |
| 2012/0262214 | A1* | 10/2012 | Hori | 327/291 |
| 2013/0142283 | A1* | 6/2013 | Hori | 375/300 |

FOREIGN PATENT DOCUMENTS

| JP | 07-254823 A | 10/1995 |
| JP | 2000-049613 A | 2/2000 |
| JP | 2004-165905 A | 6/2004 |
| JP | 2007-336377 A | 12/2007 |
| JP | 2011-066626 A | 3/2011 |
| JP | 2011-197002 A | 10/2011 |

OTHER PUBLICATIONS

Antoine Frappe, et al., "A digital $\Delta\Sigma$ RF signal generator for mobile communication transmitters in 90nm CMOS," in IEEE RFIC Symp., Jun. 2008, pp. 13-16.

International Search Report of PCT/JP2013/053908 dated May 21, 2013.

* cited by examiner

TRANSMITTER AND TRANSMITTING METHOD

CROSS REFERENCE TO RELATED APPLICATIONS

This is a National Stage of International Application No. PCT/JP2013/053908 filed Feb. 19, 2013, claiming priority based on Japanese Patent Application No. 2012-066261 filed Mar. 22, 2012, the contents of all of which are incorporated herein by reference in their entirety.

TECHNICAL FIELD

The present invention relates to transmitters used for communication devices such as mobile phones and wireless LANs (Local Area Networks).

BACKGROUND ART

Transmitters used for communication devices such as mobile phones and wireless LANs are required to ensure the accuracies of radio signals regardless of the strengths of transmission powers and to operate with lower power consumption. In particular, since a power amplifier located at the most downstream stage of a transmitter consumes 50% or more of the entire power consumption of the transmitter, a power amplifier is required to have a high power efficiency.

In recent years, as a power amplifier that is expected to have a high power efficiency, a switching amplifier has gained attention. A switching amplifier inputs a pulse wave-form signal and amplifiers the power of the pulse wave-form signal while keeping the wave-form.

In a transmitter using a switching amplifier, a filter element satisfactorily suppresses other than a desired frequency component of the output signal of the switching amplifier. Thereafter, the resultant signal is emitted from an antenna.

FIG. 1 shows an ordinary example of the structure of a class-D amplifier that typifies a switching amplifier.

The class-D amplifier shown in FIG. 1 has two switch elements $SW_0$ and $SW_G$ located in series between the power supply and the ground. Complementary pulse signals as open/close control signals are input to the two switch elements $SW_0$ and $SW_G$ such that one of these switch elements becomes the ON state. When the switch element $SW_0$ on the power supply side becomes the ON state and the switch element $SW_G$ on the ground side becomes the OFF state, the output voltage of the amplifier is the power supply voltage; otherwise, the output voltage of the amplifier is a ground potential.

Since a class-D amplifier does not require a bias current, the power loss is ideally 0. Switch elements can be composed of electric field transistors, bi-polar transistors, or the like.

FIG. 2 shows an ordinary example of the structure of a multi-level class-D amplifier that outputs a voltage in multiple levels.

The multi-level class-D amplifier shown in FIG. 2 has a plurality (N+1) of switch elements $SW_0$, $SW_1$, ..., and $SW_N$ connected between a plurality (N+1) of power supplies and the output terminal. The plurality of switch elements $SW_0$, $SW_1$, ..., and $SW_N$ are controlled so that only one of them becomes the ON state. The output voltage of the amplifier is the voltage of the power supply connected to a switch element that is the ON state. In other words, the multi-level class-D amplifier can output voltages corresponding to the number of power supplies.

Here, the structure of a transmitter using a class-D amplifier will be described.

For example, a W-CDMA (Wideband Code Division Multiple Access) transmitter generates a digital baseband (hereinafter referred to as DBB) signal and amplifiers it. The DBB signal is a multi-bit signal composed of 10 bits or more; however, the number of bits of a signal that can be input to the class-D amplifier is smaller than the number of bits of the DBB signal.

Thus, when the DBB signal is used for the class-D amplifier, the number of bits of the DBB signal is required to be decreased. Generally, if the low order bits are simply discarded, whenever one low order bit is discarded, the quantization noise increases by 6 dB. The delta-sigma modulator is a circuit technique that can decrease the number of bits without increasing the quantization noise in the band in the neighborhood of a desired frequency.

In the transmitter using the delta-sigma modulator, the modulator performs the delta-sigma modulation for a DBB signal, an amplitude signal generated based on the DBB signal, or the like. The number of bits of the output signal of the delta-sigma modulator is set to be the same number with the number of bits that can be input to the class-D amplifier located on the downstream side of the delta-sigma modulator.

FIG. 3 shows an ordinary example of the structure of the delta-sigma modulator (Non-Patent Literature 1, page 71).

The delta-sigma modulator shown in FIG. 3 has adders 131-1 and 131-2, delaying units 132-1 and 132-2, and quantizer 300. Delaying unit 132-1 and adder 131-2 compose an inner integrating unit.

Quantizer 300 quantizes the output signal of adder 131-2 with a predetermined number of bits.

Delaying unit 132-2 delays the output signal of quantizer 300 by one clock cycle.

Adder 131-1 calculates the difference between the input signal and the output signal of delaying unit 132-2.

Delaying unit 132-1 delays the output signal of adder 131-2 by one clock cycle.

Adder 131-2 calculates the sum of the output signal of adder 131-1 and the output signal of delaying unit 132-1.

If the input signal of the delta-sigma modulator is represented by U(z), the output signal thereof is represented by V(z), and the quantization noise that occurred in quantizer 300 is represented by E(z), the following formula can be obtained.

[Formula 1]

$$V(z) = U(z) + (1-z^{-1}) \cdot E(z) \quad (1)$$

The noise N(z) contained in the output signal V(z) can be expressed by the following formula.

[Formula 2]

$$N(z) = (1-z^{-1}) \cdot E(z) \quad (2)$$

where

[Formula 3]

$$z = \exp(2\pi j f / f\text{clk}) \quad (3)$$

where f is the signal frequency of the radio signal; and fclk is the clock frequency of the delta-sigma modulator.

Thus, if the signal band that a desired radio signal occupies is represented by fB, the integrated noise in the signal band can be expressed by the following formula.

[Formula 4]

$$\int_0^{fB} |1 - \exp(-2\pi j f / f\text{clk})| \cdot |E(z)| \, df \quad (4)$$

The W-CDMA technique requires 33 dB or greater of SNR (Signal-Noise Ratio) in the neighborhood of a desired signal band. To satisfy this requirement and to decrease the integrated noise expressed by formula (4), fclk is required to be increased; E(z) is required to be decreased.

Non-Patent Literature 2 discloses a delta-sigma modulator that operates at 4 GHz of fclk. To decrease E(z), quantizer 300 is required to quantize a signal with multiple bits. Although Non-Patent Literature 2 discloses the quantizer that quantizes a signal with one bit, if the number of bits of the quantizer is increased, the operation speed, that is to say, fclk will be decreased.

RELATED ART LITERATURE

Non-Patent Literature

Non-Patent Literature 1: RICHARD SCHREIER, GABOR C. TEMES, "Understanding Delta-Sigma Data Converters," IEEE Press, Nov. 8, 2004

Non-Patent Literature 2: A. Frappe, B. Stefanelli, A. Flament, A. Kaiser and A. Cathelin, "A digital ΔΣ RF signal generator for mobile communication transmitters in 90 nm CMOS," in IEEE RFIC Symp., pp. 13-16, June 2008

SUMMARY OF THE INVENTION

Problem to be Solved by the Invention

As was described above, the transmitters according to the related art have a problem in which both the high speed operation of the delta-sigma modulator and the decrease of the quantization noise thereof cannot be simultaneously satisfied.

An object of the present invention is to provide a transmitter and transmitting method that can simultaneously satisfy both the high speed operation of the delta-sigma modulator and the decrease of the quantization noise thereof.

Means that Solve the Problem

A transmitter according to the present invention includes:
a level detector that detects the level value of an input signal, from among a predetermined number of level values;
an upstream-side signal adjusting unit that amplifies said input signal and shifts said input signal for an offset amount based on an output signal of said level detector;
a digital-sigma modulator having a quantizer that quantizes an output signal of said upstream-side signal adjusting unit with a predetermined number of bits, and
a downstream-side signal adjusting unit that amplifies an output signal of said delta-sigma modulator and shifts the output signal of said delta-sigma modulator for an offset amount based on the output signal of said level detector.

A transmitting method according to the present invention is a transmitting method for a transmitter, including:
detecting the level value of an input signal, from among a predetermined number of level values;
amplifying said input signal and shifting said input signal for an offset amount based on the level value of said input signal as an upstream-side process;
quantizing a signal for which said upstream side process has been performed with a predetermined number of bits, and
amplifying the signal that has been quantized and shifting the signal that has been quantized for an offset amount based on the level value of said input signal as a downstream-side process.

Effect of the Invention

In the transmitter according to the present invention, before the delta-sigma modulator performs the delta-sigma modulation for a signal, since the upstream-side signal adjusting unit amplifies the signal, the signal power ratio to the quantization noise, in which the quantization noise occurs when the delta-sigma modulator performs the delta-sigma modulation for the signal, can be increased. As a result, the quantization noise to the signal strength is relatively decreased. In addition, since the delta-sigma modulator has a 1-bit quantizer that quantizes a signal with one bit, the delta-sigma modulator can ensure high speed operation.

Thus, both the high speed operation of the delta-sigma modulator and a decrease of the quantization noise thereof can be simultaneously satisfied.

BEST MODES THAT CARRY OUT THE INVENTION

Next, with reference to the accompanying drawings, exemplary embodiments of the present invention will be described.

(1) First Exemplary Embodiment

Figure 4:
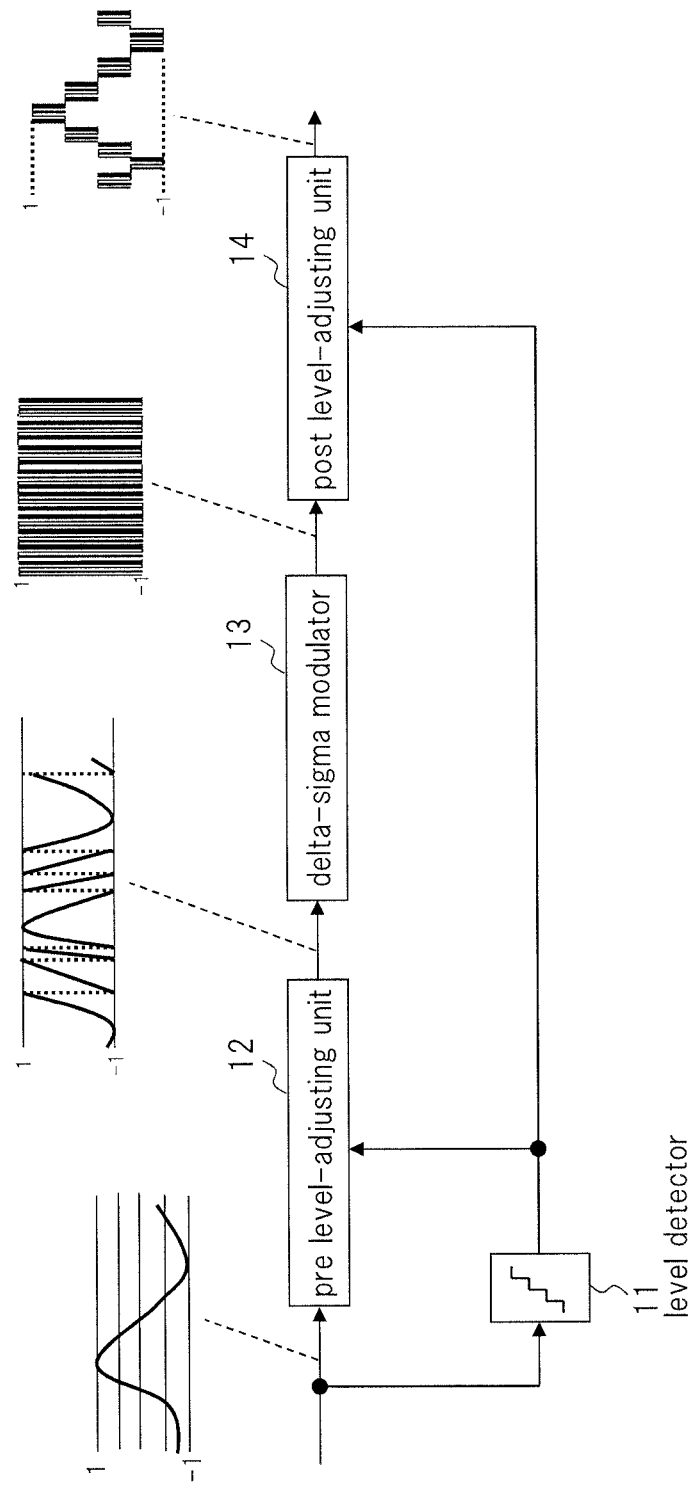
FIG. 4 is a circuit block diagram showing an example of the structure of a transmitter according to a first exemplary embodiment of the present invention.

FIG. 4 shows an example of the structure of a section in the neighborhood of a delta-sigma modulator of a transmitter according to a first exemplary embodiment of the present invention.

Referring to FIG. 4, the transmitter according to this exemplary embodiment has level detector 11, pre level-adjusting unit 12 that is an upstream-side signal adjusting unit, delta-sigma modulator 13, and post level-adjusting unit 14 that is a downstream-side signal adjusting unit. In the following description, for convenience, the circuit that is composed of the constituent elements shown in FIG. 4 is referred to as "digital modulator."

Level detector 11 detects the level value of an input signal, from among a predetermined number of level values.

If the number of level values that level detector 11 can detect is represented by N, the values of the input signal assigned to individual level values are as follows. The valid input range of level detector 11 is $V_{MIN} \sim V_{MAX}$.

Level value 1: $V_{MIN} \sim V_1$
Level value 2: $V_1 \sim V_2$
...
Level value N: $V_{N-1} \sim V_{MAX}$ The foregoing variables satisfy the relationship of $V_{MIN} < V_1 < V_2 < \ldots < V_{MAX}$.

Pre level-adjusting unit 12 amplifies the input signal and shifts the input signal for an offset amount (namely, pre level-adjusting unit 12 shifts the potential of the signal) based on the level value detected by level detector 11 such that the resultant signal matches the valid input range of delta-sigma modulator 13 located on the downstream side.

In the case in which the valid input range of delta-sigma modulator 13 is Vdsmmin~Vdsmmax, if the level value detected by level detector 11 is k (namely, the value of the input signal ranges $V_{k-1} \sim V_k$), the transfer function of pre level-adjusting unit 12 can be expressed by the following formula. In this example, the input signal and the output signal of pre level-adjusting unit 12 are represented by Vtunein, and Vtuneout, respectively.

[Formula 5]

$$V\text{tuneout} = (Vdsm\text{max} - Vdsm\text{min}) \cdot (V\text{tunein} - V_{k-1})/(V_k - V_{k-1}) + Vdsm\text{min} \quad (5)$$

In other words, the foregoing transfer function represents a linear transform in which when the input signal is $V_{k-1}$, the output signal becomes Vdsmmin and when the input signal is $V_k$, the output signal becomes Vdsmmax.

Figure 3:
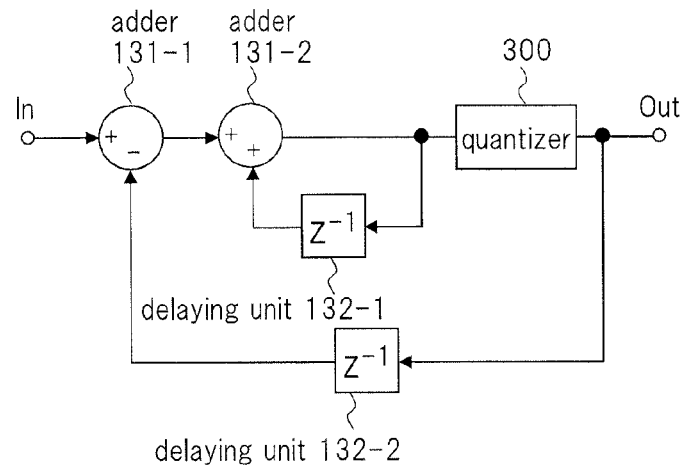
FIG. 3 is a circuit block diagram showing an example of the structure of a delta-sigma modulator according to the related art.
Figure 5:
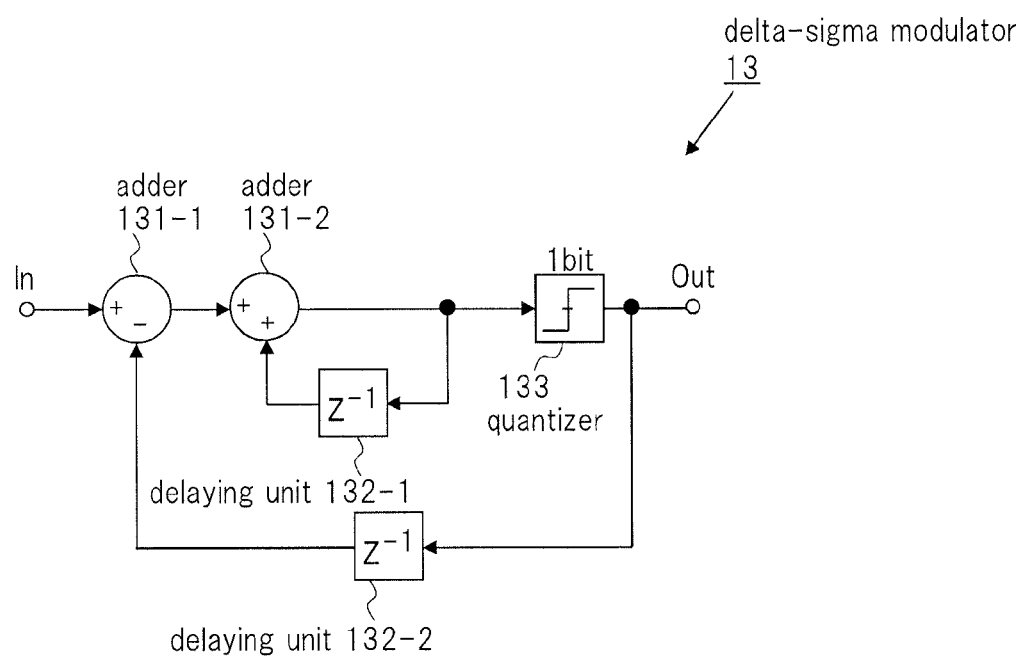
FIG. 5 is a circuit block diagram showing an example of the structure of a delta-sigma modulator shown in FIG. 4.

As shown in FIG. 5, delta-sigma modulator 13 is composed of a linear delta-sigma modulator in which quantizer 300 shown in FIG. 3 is replaced with 1-bit quantizer 133.

The output signal of delta-sigma modulator 13 is a 1-bit high/low signal where the output value assigned as a physical amount to high is Vdsmmax and the output value assigned as a physical amount to low is Vdsmmin.

The output values assigned to the output signal, high/low, of delta-sigma modulator 13 may be values other than Vdsmmax/Vdsmmin.

The structure of delta-sigma modulator 13 is not limited to that shown in FIG. 5. Instead, delta-sigma modulator 13 may have a quantizer that quantizes a signal with different bits. In addition, delta-sigma modulator 13 may have a different transfer function.

Post level-adjusting unit 14 amplifies the output signal of delta-sigma modulator 13 and shifts the output signal of delta-sigma modulator 13 for an offset amount, using the inverse function of the transfer function of pre level-adjusting unit 12.

In other words, post level-adjusting unit 14 amplifies the output signal of delta-sigma modulator 13 with an amplification factor that is the reciprocal of the amplification factor of pre level-adjusting unit 12. Also, post level-adjusting unit 14 shifts the output signal of delta-sigma modulator 13 for an offset amount, that is the same as the offset amount of pre level-adjusting unit 12, in the reverse direction to that of pre level-adjusting unit 12 (namely, post level-adjusting unit 14 shifts the potential of the signal, in which the shift amount is the same as the shift amount of pre level-adjusting unit 12, in the reverse direction to that of pre level-adjusting unit 12).

Namely, the input signal Vpostin and the output signal Vpostout of post level-adjusting unit 14 have a relationship expressed by the following formula.

[Formula 6]

$$V\text{postout} = (V_k - V_{k-1}) \cdot (V\text{postin} - Vdsm\text{min})(Vdsm\text{max} - Vdsm\text{min}) + V_{k-1} \quad (6)$$

In other words, the foregoing transfer function represents a linear transform in which when the input signal is Vdsmmin, the output signal becomes $V_{k-1}$ and when the input signal is Vdsmmax, the output signal becomes $V_k$.

In the case in which the input signal of the digital modulator is S(z), when S(z) is substituted into the right side Vtunein of formula (5), the output signal Vtuneout of pre level-adjusting unit 12 can be expressed by the following formula.

[Formula 7]

$$V\text{tuneout} = (Vdsm\text{max} - Vdsm\text{min}) \cdot (S(z) - V_{k-1})/(V_k - V_{k-1}) + Vdsm\text{min} \quad (7)$$

When the right side of Formula (7) is substituted into U(z) of Formula (1), the output signal V(z) of delta-sigma modulator 13 can be expressed by the following formula.

[Formula 8]

$$V(z) = (Vdsm\text{max} - Vdsm\text{min}) \cdot (S(z) - V_{k-1})/(V_k - V_{k-1}) + Vdsm\text{min} + (1 - z^{-1}) \cdot E(z) \quad (8)$$

When the right side of Formula (8) is substituted into Vpostin of Formula (6), the output signal Vpostout of post level-adjusting unit 14 can be expressed by the following formula.

[Formula 9]

$$V\text{postout} = S(z) + (V_k - V_{k-1})/(Vdsm\text{max} - Vdsm\text{min}) \cdot ((1 - z^{-1}) \cdot E(z)) \quad (9)$$

The right side of Formula (9) includes terms of the input signal and the quantization noise.

The term of the quantization noise is represented by the product of the quantization noise $(=(1-z^{-1}) \cdot E(z))$ and the coefficient $(V_k - V_{k-1})/(Vdsm\text{max} - Vdsm\text{min})$. "$V_k - V_{k-1}$" of the foregoing coefficients represents the width of the value of the input signal corresponding to one level value of level detector 11. When this width is decreased, the ratio of the quantization noise to the output signal of post level-adjusting unit 14 can be decreased.

As an example of specific numerical values, it is assumed that the minimum value/maximum value ($V_{MIN}/V_{MAX}$) of the valid input range of level detector 11 is equal to the minimum value/maximum value (Vdsmmax/Vdsmmin) of the valid input range of delta-sigma modulator 13 and that the increments of the level value of level detector 11 are constant and are ⅛ of the valid input range of delta-sigma modulator 13. In this case, the coefficient of the quantization noise of Formula (9) becomes ⅛. Whenever the number of bits of the quantizer is increased by one bit, the quantization noise is halved. Thus, this example of the numerical values allow 1-bit quantizer 133 to decrease the quantization noise that corresponds to the quantization noise in the case where a 4-bit quantizer is employed.

In other words, as is clear from Formula (5), before a signal is input to delta-sigma modulator 13, the signal is amplified (in Formula (5), the coefficient "Vdsmmax−Vdsmmin/($V_k$−$V_{k-1}$)" multiplied by a term including Vtunein represents the amplification factor). Thus, the quantization noise is relatively decreased and thereby the SNR is increased.

As described above, according to this exemplary embodiment, although delta-sigma modulator 13 having 1-bit quantizer 133 operates at high speed, delta-sigma modulator 13 can decrease the quantization noise that corresponds to the quantization noise in the case where a delta-sigma modulator having a multi-bit quantizer is employed.

Figure 6:
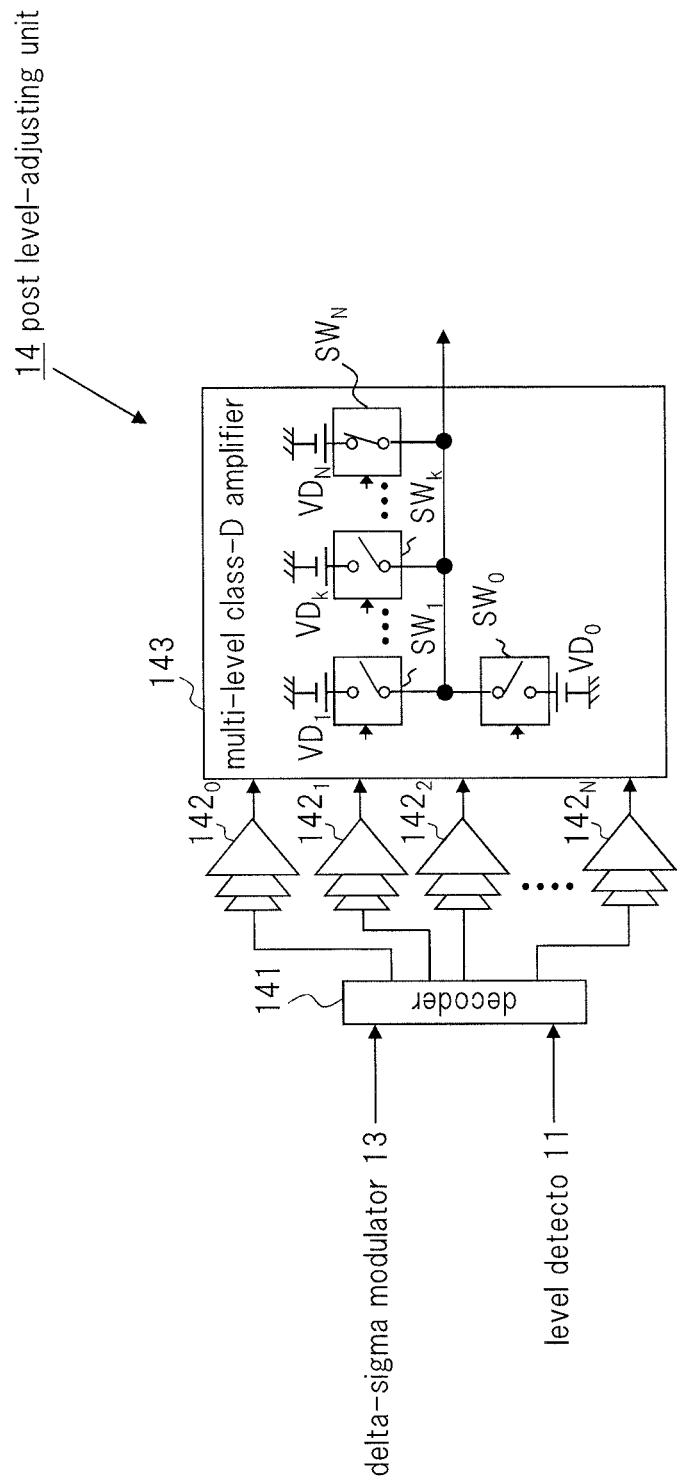
FIG. 6 is a circuit block diagram showing an example of the structure of a post-level adjusting unit shown in FIG. 4.

FIG. 6 shows an example of the structure of post level-adjusting unit 14.

Referring to FIG. 6, post level-adjusting unit 14 has decoder 141, driver amplifiers 142₀, 142₁, . . . , and 142$_N$, and multi-level class-D amplifier 143.

Figure 1:
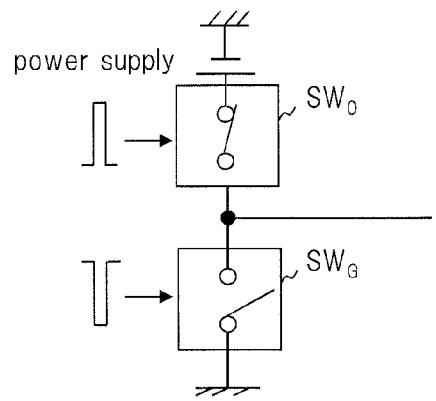
FIG. 1 is a circuit block diagram showing an example of the structure of a class-D amplifier according to the related art.
Figure 2:
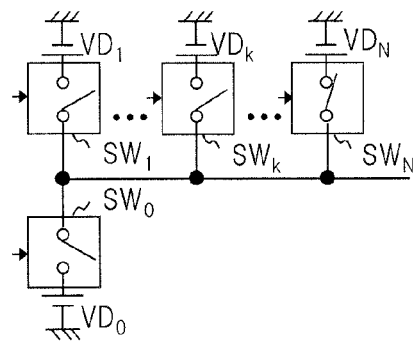
FIG. 2 is a circuit block diagram showing an example of the structure of a multi-level class-D amplifier according to the related art.

Multi-level class-D amplifier 143 is the same as the multi-level class-D amplifier shown in FIG. 2.

Driver amplifiers 142₀, 142₁, . . . , and 142$_N$ are located corresponding to switch elements $SW_0$, $SW_1$, . . . , and $SW_N$ that composes multi-level class-D amplifier 143 and output an open/close control signal that is input from decoder 141 to the corresponding switch elements.

Decoder 141 outputs the open/close control signal to switch elements $SW_0$, $SW_1$, . . . , and $SW_N$ respectively through driver amplifiers 142₀, 142₁, . . . , and 142$_N$ based on the output signal of delta-sigma modulator 13 and the output signal of level detector 11 so as to control the opening/closing of switch elements $SW_0$, $SW_1$, . . . , and $SW_N$.

As described above, multi-level class-D amplifier 143 is composed of (N+1) switch elements $SW_0$, $SW_1$, . . . , and $SW_N$ respectively connected to (N+1) power supplies. The voltage values $VD_0$, $VD_1$, . . . , and $VD_N$ of the (N+1) power supplies are respectively correlated with the boundary values $V_{MIN}$, $V_1$, $V_2$, . . . , and $V_{MAX}$ of the individual level values detected by level detector 11 as expressed by the following formula.

[Formula 10]

$$\left.\begin{array}{l} VD_0 = a \cdot V_{MIN} + b \\ VD_1 = a \cdot V_1 + b \\ VD_2 = a \cdot V_2 + b \\ \ldots \\ VD_k = a \cdot V_k + b \\ \ldots \\ VD_{N-1} = a \cdot V_{N-1} + b \\ VD_N = a \cdot V_{MAX} + b \end{array}\right\} \quad (10)$$

where a and b are any constants.

Decoder 141 generates the open/close control signal for the individual switch elements $SW_0$, $SW_1$, . . . , and $SW_N$ of multi-level class-D amplifier 143 based on the output signal of level detector 11 and the output signal of delta-sigma modulator 13 in the following manner.

In the case where the level value detected by level detector 11 is k, for example, when the 1-bit signal that is output from delta-sigma modulator 13 is high, decoder 141 causes the switch element $SW_K$ to become the ON state; when the 1-bit signal is low, decoder 141 causes the switch element $SW_{K-1}$ to become the ON state. Only one switch element is caused to become the ON state; the other switch elements are caused to be the OFF state.

When the 1-bit signal that is output from delta-sigma modulator 13 is high, decoder 141 causes the output voltage of multi-level class-D amplifier 143 to become $VD_K$; when the 1-bit signal is low, decoder 141 causes the output voltage to become $VD_{K-1}$.

If Vdsmmax and Vdsmmin are respectively assigned to high and low of the 1-bit signal that is output from delta-sigma modulator 13, the input signal VDin and the output signal VDout of post level-adjusting unit 14 satisfy the following formula.

[Formula 11]

$$VDout = (VD_k - VD_{k-1})/(Vdsm\max - Vdsm\min) \cdot (VDin - Vdsm\min) + VD_{k-1} \quad (11)$$

When the output signal of delta-sigma modulator 13 expressed on the right side of Formula (8) is substituted into VDin of Formula (10), the output signal of multi-level class-D amplifier 143 can be expressed by the following formula.

[Formula 12]

$$VDout = (VD_k - VD_{k-1})/(V_k - V_{k-1}) \cdot (S(z) - V_{k-1}) + (VD_k - VD_{k-1})/(Vdsm\max - Vdsm\min) \cdot (1 - z^{-1}) \cdot E(z) + VD_{k-1} \quad (12)$$

When Formula (10) is substituted into Formula (12), the output signal of multi-level class-D amplifier 143 can be expressed by the following formula.

[Formula 13]

$$VDout = a \cdot \{S(z) + (V_k - V_{k-1})/(Vdsm\max - Vdsm\min) \cdot (1 - z^{-1}) \cdot E(z)\} + b \quad (13)$$

Formula (13) denotes that coefficient a is multiplied by the right side of Formula (9) and then coefficient b is added as the shift amount of the offset amount (namely, potential shift amount).

Thus, quantization noise that affects a desired radio signal with respect to Formula (9) is equal to that with respect to Formula (13).

As a result, this exemplary embodiment has an effect in which although delta-sigma modulator 13 that has 1-bit quantizer 133 operates at high speed, delta-sigma modulator 13 can decrease the quantized nose that corresponds to the quantization noise in the case where a delta-sigma modulator having a multi-bit quantizer is employed.

(2) Second Exemplary Embodiment

Figure 7:
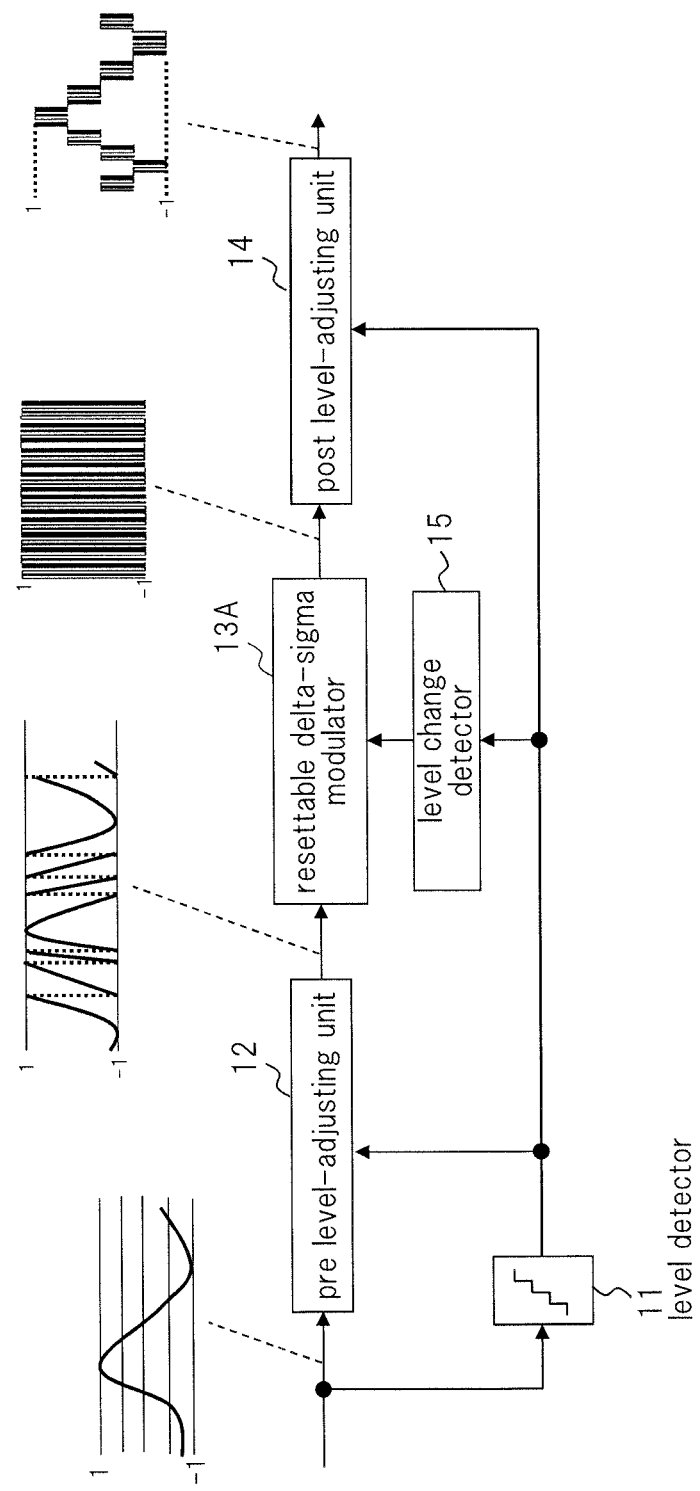
FIG. 7 is a circuit block diagram showing an example of the structure of a transmitter according to a second exemplary embodiment of the present invention.

FIG. 7 shows an example of the structure of a section in the neighborhood of a delta-sigma modulator of a transmitter according to a second exemplary embodiment of the present invention.

Referring to FIG. 7, the transmitter according to this exemplary embodiment is different from the transmitter according to the first exemplary embodiment shown in FIG. 4 in that the former has resettable delta-sigma modulator 13A instead of delta-sigma modulator 13 and also in that the former has level-change detector 15 that generates a reset signal, reset, and outputs it to resettable delta-sigma modulator 13A. In the following description, for simplicity, the circuit composed of the constituent elements shown in FIG. 7 is referred to as "digital modulator."

Figure 8:
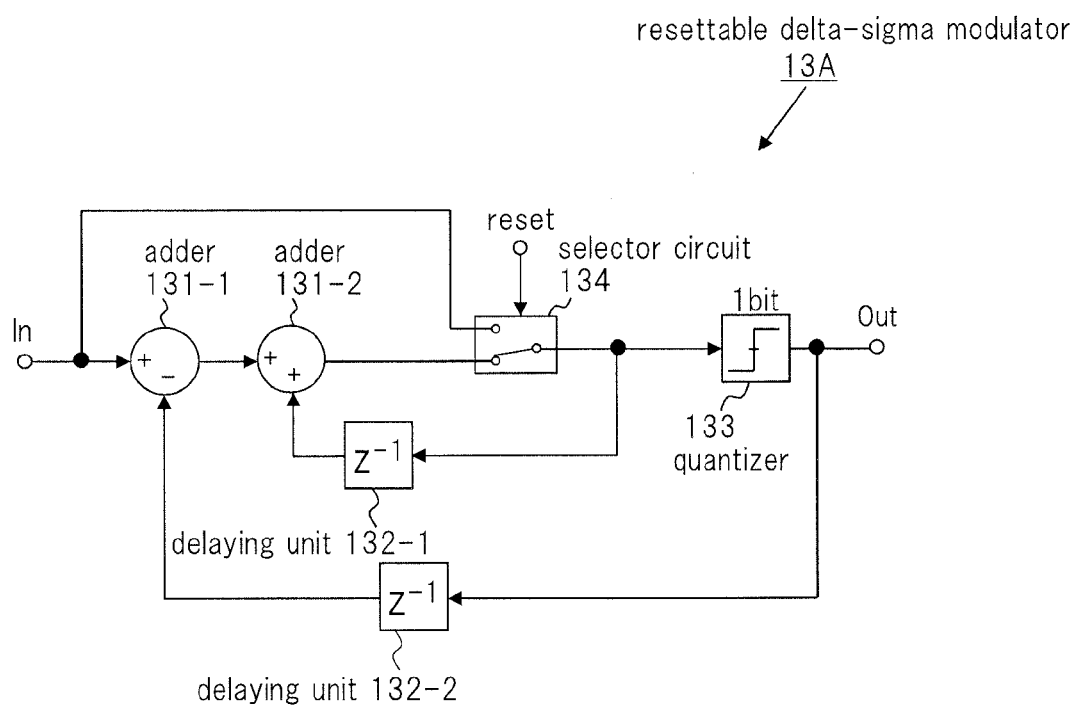
FIG. 8 is a circuit block diagram showing an example of the structure of a resettable delta-sigma modulator shown in FIG. 7.

FIG. 8 shows an example of the structure of resettable delta-sigma modulator 13A.

Referring to FIG. 8, resettable delta-sigma modulator 13A is different from delta-sigma modulator 13 shown in FIG. 5 in that the former has selector circuit 134 located on the downstream side of adder 131-2.

Selector circuit 134 selects either the output signal of adder 131-2 or the input signal of resettable delta-sigma modulator 13A depending on the reset signal, reset, that is input from level change detector 15 and outputs the selected signal to quantizer 133 and delaying unit 132-1. In the following description, it is assumed that if the reset signal, reset, is high, the input signal of resettable delta-sigma modulator 13A is selected.

Figure 9:
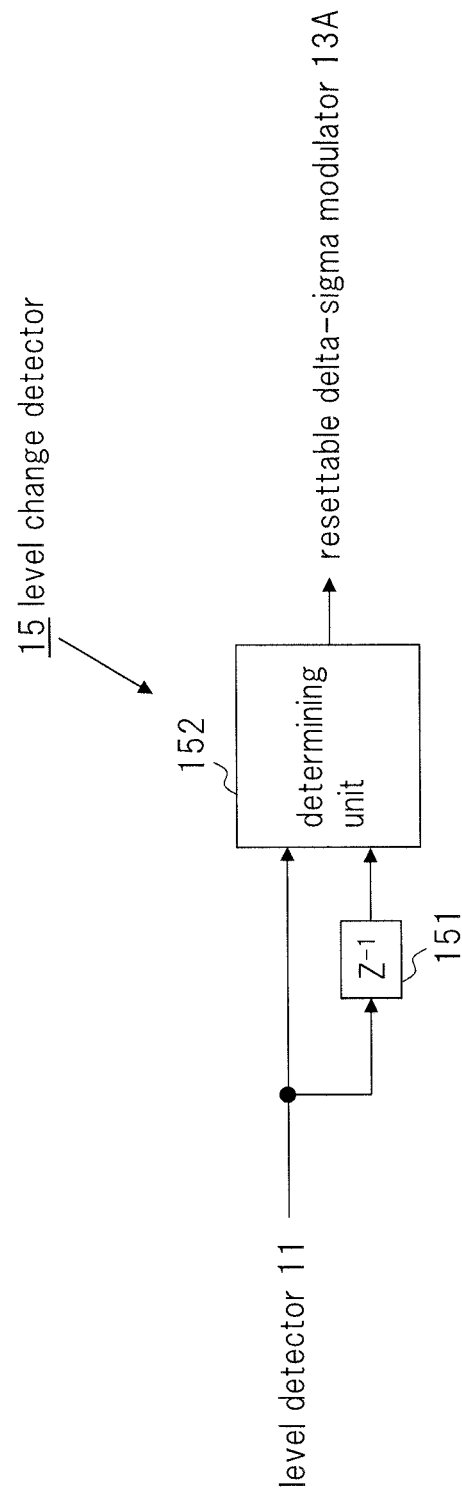
FIG. 9 is a circuit block diagram showing an example of the structure of a level-change detector shown in FIG. 7.

FIG. 9 shows an example of the structure of level-change detector 15.

Referring to FIG. 9, level-change detector 15 has delaying unit 151 and determining unit 152.

Delaying unit 151 delays the input signal of level-change detector 15 by one clock cycle.

Determining unit 152 compares the input signal of level-change detector 15 with the input signal that occurred one clock cycle earlier (namely, the output signal of delaying unit 151) and determines whether they are equal to each other. If they are equal to each other, determining unit 152 outputs the reset signal, reset, that is low; otherwise, determining unit 152 outputs the reset signal, reset, that is high.

Referring to FIG. 7 again, the input signal of level-change detector 15 is the output signal of level detector 11.

Thus, if the output signal of level detector 11 is equal to the output signal that occurred one clock cycle earlier, the level-change detector 15 outputs the reset signal, reset, that is low. Thus, the output signal of adder 131-2 is input to quantizer 133 and delaying unit 132-1 of resettable delta-sigma modulator 13A. In this state, resettable delta-sigma modulator 13A has the same structure as delta-sigma modulator 13 shown in FIG. 5 has.

On the other hand, if the output signal of level detector 11 is not equal to the output signal that occurred one clock cycle earlier, level change detector 15 outputs the reset signal, reset, that is high. Thus, the input signal of resettable delta-sigma modulator 13A is input to quantizer 133 and delaying unit 132-1 of resettable delta-sigma modulator 13A. In this state, the input signal of delaying unit 132-1 forcibly becomes the input signal of resettable delta-sigma modulator 13A. As a result, an inner integrating unit composed of delaying unit 132-2 and adder 131-2 is reset. In other words, the input signal of quantizer 133 becomes the input signal of resettable delta-sigma modulator 13A regardless of the level of the input signal that occurred one clock cycle earlier. In contrast, in delta-sigma modulator 13 shown in FIG. 5, the input signal of quantizer 133 is the sum of the output signal of adder 131-1 and the output signal of delaying unit 132-1 that occurred one clock cycle earlier. Thus, the input signal of quantizer 133 is affected by the level of the input signal that occurred one clock cycle earlier.

As described above, according to this exemplary embodiment, if the level value detected by level detector 11 changes, the inner integrating unit of resettable delta-sigma modulator 13A is reset. As a result, resettable delta-sigma modulator 13A can perform the delta-sigma modulation regardless of the level of the input signal that occurred one clock cycle earlier. The other effects of this exemplary embodiment are the same as those of the first exemplary embodiment.

Figure 10:
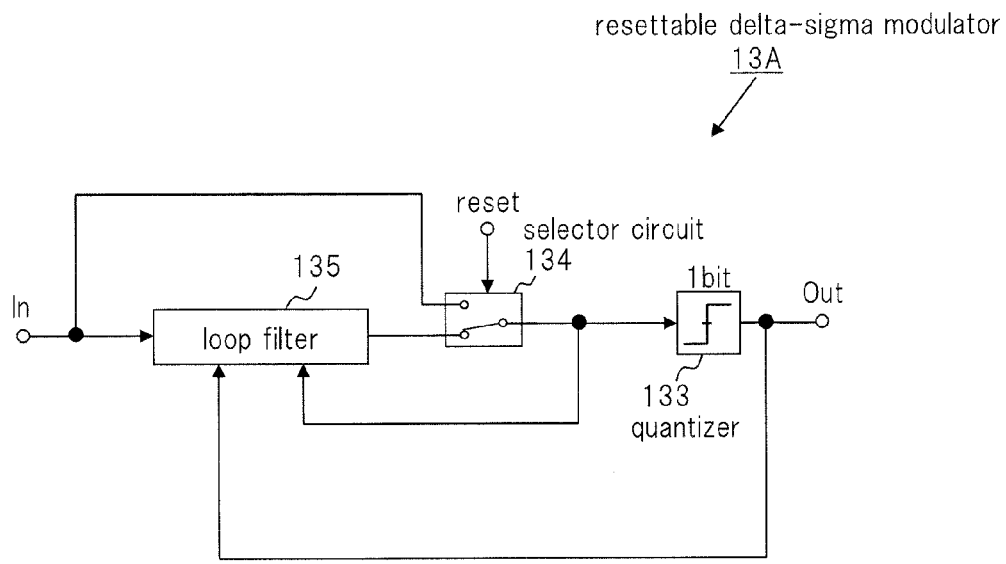
FIG. 10 is a circuit block diagram showing an example of the structure of the resettable delta-sigma modulator shown in FIG. 7.
Figure 11:
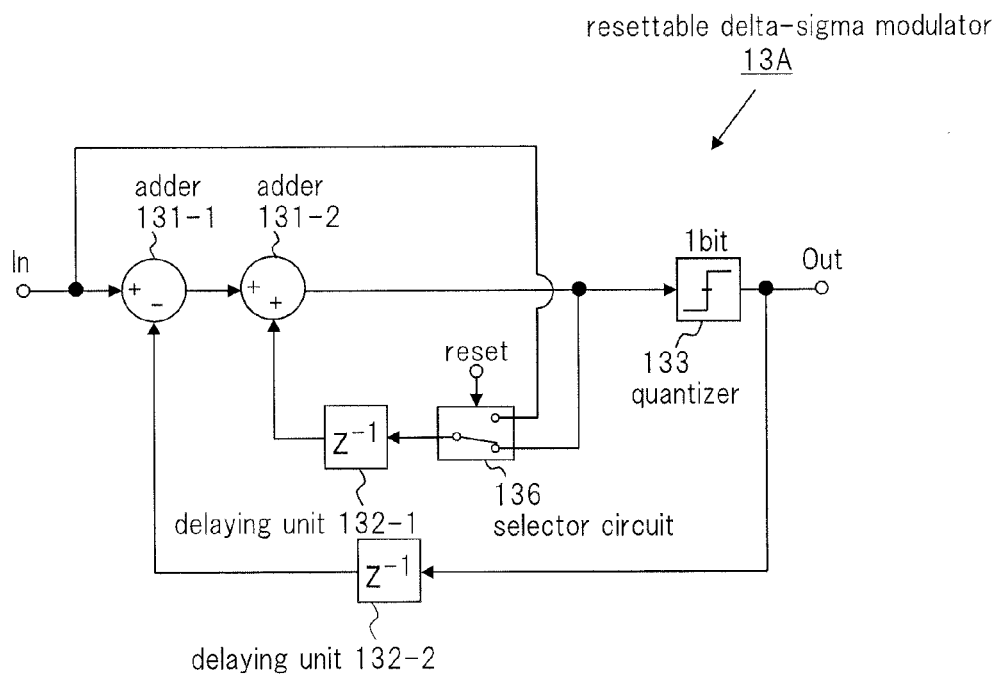
FIG. 11 is a circuit block diagram showing an example of the structure of the resettable delta-sigma modulator shown in FIG. 7.

FIG. 10 and FIG. 11 show another example of the structure of resettable delta-sigma modulator 13A.

Resettable delta-sigma modulator 13A shown in FIG. 10 has loop filter 135, selector circuit 134, and quantizer 133.

Quantizer 133 is the same as that shown in FIG. 8.

Selector circuit 134 is located at an output section of loop filter 135.

FIG. 8 shows that loop filter 135 is a linear delta-sigma modulator composed of adder 131-1, adder 131-2, delaying unit 132-1, and delaying unit 132-2.

The structure of loop filter 135 may be not limited to the structure shown in FIG. 8. Loop filter 135 may accomplish a high-order delta-sigma modulator. The structure of loop filter 135 that accomplishes a quadratic delta-sigma modulator is disclosed on page 64 of Non-Patent Literature 1.

Resettable delta-sigma modulator 13A shown in FIG. 11 is different from that shown in FIG. 8 in that the former has selector circuit 136 located on the upstream side of delaying unit 131-1 instead of selector circuit 134.

Selector circuit 136 selects either the output signal of adder 131-2 or the input signal of resettable delta-sigma modulator 13A based on the reset signal, reset, that is input from level-change detector 15 and outputs the selected signal to delaying unit 132-1.

Thus, resettable delta-sigma modulator 13A, having the structure shown in FIG. 11, can reset the inner integrating unit composed of delaying unit 132-1 and adder 131-2.

(3) Third Exemplary Embodiment

Figure 12:
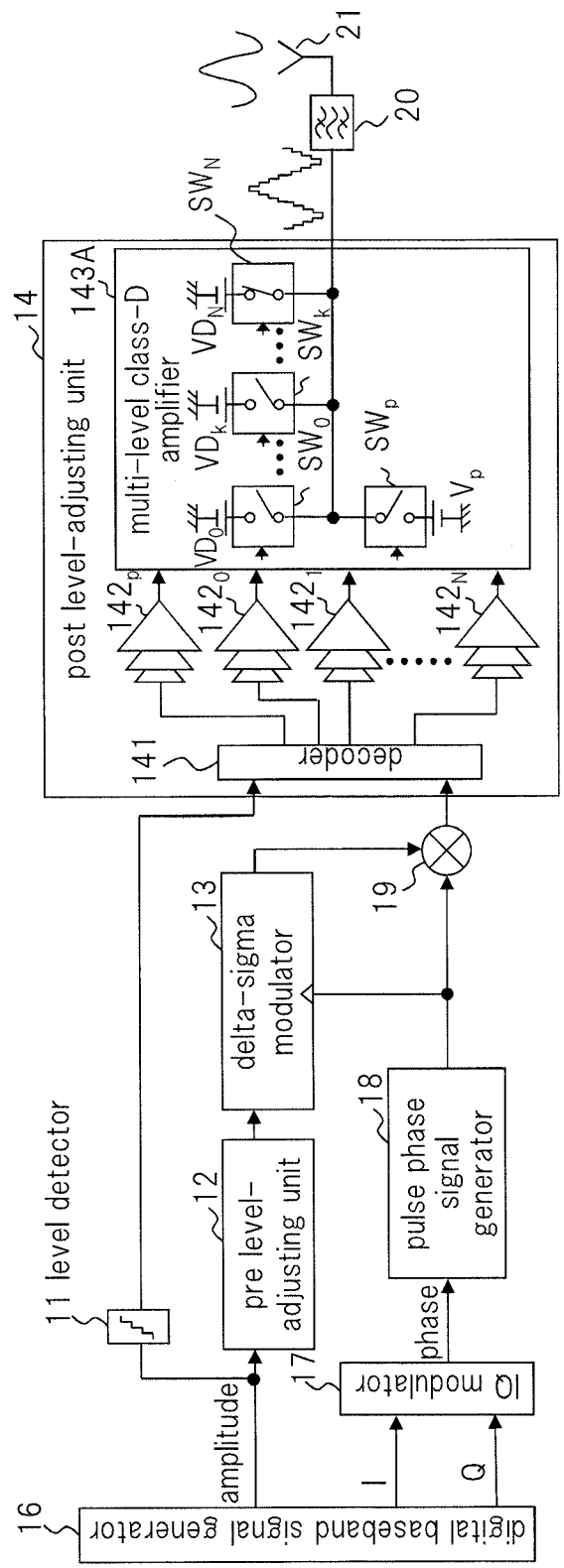
FIG. 12 is a circuit block diagram showing an example of the structure of a transmitter according to a third exemplary embodiment of the present invention.

FIG. 12 shows an example of the overall structure of a transmitter according to a third exemplary embodiment of the present invention.

Referring to FIG. 12, the transmitter according to this exemplary embodiment has level detector 11, pre level-adjusting unit 12 that is an upstream-side signal adjusting unit, delta-sigma modulator 13, post level-adjusting unit 14 that is a downstream-side signal adjusting unit, digital baseband signal generator 16, IQ modulator 17, pulse phase signal generator 18, multiplying unit 19, filter element 20, and antenna 21.

Digital baseband signal generator 16 generates orthogonal phase baseband signals I(t) and Q(t) and an amplitude signal A(t). The amplitude signal A(t) is equal to the square root of the sum of the square of the orthogonal phase baseband signals I(t) and Q(t).

IQ modulator 17 generates an RF signal RF(t) based on the orthogonal phase baseband signals I(t) and Q(t) according to the following formula.

[Formula 14]

$$RF(t)=I(t)\cos(\omega t)-Q(t)\sin(\omega t) \qquad (14)$$

Formula (14) can be rewritten with respect to the amplitude signal A(t) and the phase signal θ(t) as expressed by the following formula.

[Formula 15]

$$RF(t)=A(t)\cos(\omega t+\theta(t)) \qquad (15)$$

[Formula 16]

$$A(t)=\sqrt{\{I(t)^2+Q(t)^2\}} \qquad (16)$$

[Formula 17]

$$\theta(t)=\tan^{-1}(Q(t)/I(t)) \qquad (17)$$

where ω is the angular frequency whose carrier frequency is multiplied by 2π.

The RF phase signal RFθ(t) is defined by the following formula.

[Formula 18]

$$RF\theta(t)=\cos(\omega t+\theta(t)) \qquad (18)$$

IQ modulator 17 outputs the RF phase signal RFθ(t) to pulse phase signal generator 18.

Figure 13:
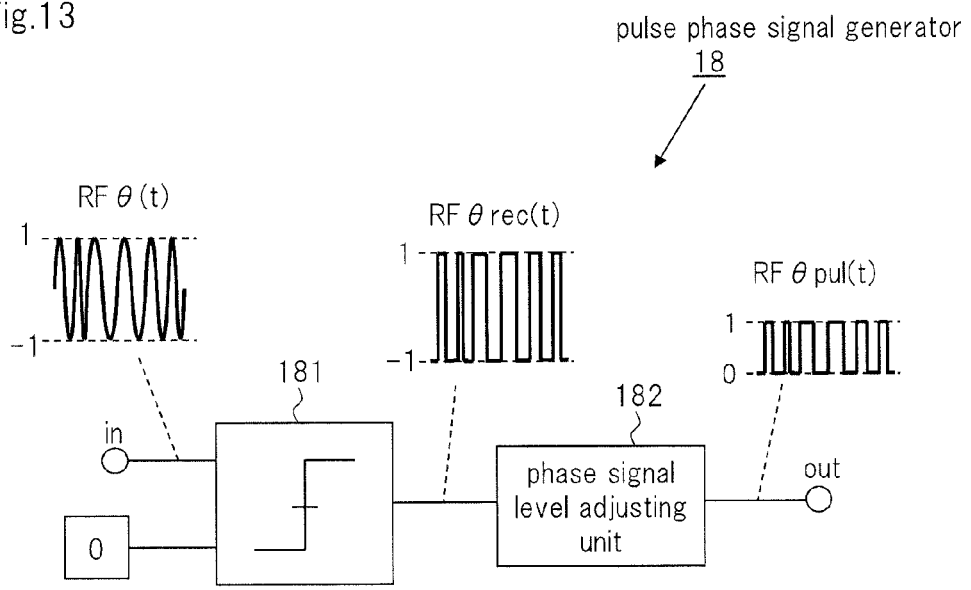
FIG. 13 is a circuit block diagram showing an example of the structure of a pulse phase signal generator shown in FIG. 12.

FIG. 13 shows an example of the structure of pulse phase signal generator 18.

Referring to FIG. 13, pulse phase signal generator 18 has comparator 181 and phase signal level adjusting unit 182.

Comparator 181 compares the RF phase signal RFθ(t) with 0. If the RF phase signal RFθ(t) is greater than 0, it is converted into a square phase signal RFθrec(t) that is 1; otherwise, it is converted into the square phase signal RFθrec(t) that is −1.

[Formula 19]

$$RF\theta rec(t) = RF\theta(t) + \text{Dis}(t) \quad (19)$$

Dis(t) represents a harmonic component of RFθ(t). Of course, RFθ(t) is −1 or 1.

Thereafter, phase signal level adjusting unit 182 adjusts the level of the square phase signal RFθrec(t) as expressed by the following formula and converts the signal into the pulse phase signal RFθpul(t).

[Formula 20]

$$RF\theta pul(t) = 0.5 \cdot RF\theta rec(t) + 0.5 \quad (20)$$

The value of the pulse phase signal RFθpul(t) is 0 or 1. If the pulse phase signal RFθpul(t) is used as an input signal of a logic circuit—for example, the clock signal of delta-sigma modulator 13, 0 and 1 are assigned to low and high, respectively.

Referring to FIG. 12 again, the connections of level detector 11, pre level-adjusting unit 12, delta-sigma modulator 13, and post level-adjusting unit 14 according to this exemplary embodiment are the same as those of the first exemplary embodiment except that the former has multiplying unit 19 located between delta-sigma modulator 13 and post level-adjusting unit 14.

In addition, the structures of level detector 11, pre level-adjusting unit 12, and delta-sigma modulator 13 are the same as those of the first exemplary embodiment.

However, the structure of post level-adjusting unit 14 according to this exemplary embodiment is different from the structure shown in FIG. 6 in that the former has multi-level class-D amplifier 143A adding switch element SW$_p$ instead of multi-level class-D amplifier 143 and the former adds driver amplifier 142$_p$ corresponding thereto.

The amplitude signal A(t) that is output from digital baseband signal generator 16 becomes the input signal of the digital modulator according to the first exemplary embodiment.

The pulse phase signal RFθpul(t) that is output from pulse phase signal generator 18 is input not only to multiplying unit 19, but also to delta-sigma modulator 13 as a clock signal that drives delta-sigma modulator 13. The constituent elements of delta-sigma modulator 13 perform the foregoing operation using the pulse phase signal RFθpul(t) as a clock signal. This structure causes the two pulse signals (the output signal of delta-sigma modulator 13 and the output signal of pulse phase signal generator 18) that are input to multiplying unit 19 to synchronize with each other.

Multiplying unit 19 multiplies the output signal of delta-sigma modulator 13 by the pulse phase signal RFθpul(t) and generates a digital signal containing the desired RF signal.

When the value of the pulse phase signal RFθpul(t) is 1, the output signal of multiplying unit 19 is the output signal of delta-sigma modulator 13; when the value of the pulse phase signal RFθpul(t) is 0, the output signal of multiplying unit 19 is 0.

As described above, multi-level class-D amplifier 143A is composed of (N+2) switch elements SW$_P$, SP$_0$, SP$_1$, ..., and SW$_N$ respectively connected to (N+2) power supplies. The voltage values V$_p$, VD$_0$, VD$_1$, ..., and VD$_N$ of (N+2) power supplies are correlated with boundary values V$_{MIN}$, V$_1$, V$_2$, ..., V$_{N-1}$, and V$_{MAX}$ of level values detected by level detector 11 as expressed by the following formula.

[Formula 21]

$$\left.\begin{aligned} Vp &= b \\ VD_0 &= a \cdot V_{MIN} + b \\ VD_1 &= a \cdot V_1 + b \\ VD_2 &= a \cdot V_2 + b \\ &\cdots \\ VD_k &= a \cdot V_k + b \\ &\cdots \\ VD_{N-1} &= a \cdot V_{N-1} + b \\ VD_N &= a \cdot V_{MAX} + b \end{aligned}\right\} \quad (21)$$

Decoder 141 generates the open/close control signal for switch elements SW$_P$, SP$_0$, SP$_1$, ..., and SW$_N$ of multi-level class-D amplifier 143A based on the output signal of level detector 11 and the output signal of multiplying unit 19 as follows.

For example, when the output signal of multiplying unit 19 is 0—namely, the value of the pulse phase signal RFθpul(t) is 0, decoder 141 causes the switch element SW$_P$ to become the ON state.

On the other hand, when the output signal of multiplying unit 19 is not 0—namely, the value of the pulse phase signal RFθpul(t) is 1, the output signal of multiplying unit 19 is the output signal of delta-sigma modulator 13. Like the first exemplary embodiment, in the case where the level value detected by level detector 11 is k, when the level of the 1-bit signal that is output from delta-sigma modulator 13 is high, decoder 141 causes the switch element SW$_K$ to become the ON state; when the level of the 1-bit signal is low, decoder 141 causes the switch element SW$_{K-1}$ to become the ON state. Only one switch element is caused to become the ON state; the other switch elements are caused to be OFF state.

When the value of the pulse phase signal RFθpul(t) is 0, decoder 141 causes the output signal of multi-level class-D amplifier 143A to become b; when the value of pulse phase signal RFθpul(t) is 1, decoder 141 causes the output signal of multi-level class-D amplifier 143A to become a value of which the Z transformed amplitude signal (A(t) in the time domain) is substituted into S(z) on the left side of Formula (13) in the output signal of selector circuit 134 of the first exemplary embodiment.

In other words, the output signal VDout2(t) of multi-level class-D amplifier 143A can be expressed by the following formulas:

when the value of the pulse phase signal RFθpul(t) is 0,

[Formula 22]

$$VDout2(t) = b \quad (22)$$

when the value of the pulse phase signal RFθpul(t) is 1,

[Formula 23]

$$VDout2(t) = a \cdot \{A(t) + (V_k - V_{k-1})/(Vdsm\max - Vdsm\min) \cdot Edsm(t)\} + b \quad (23)$$

Formula (23) denotes that the Z-transformed amplitude signal (A(t) in the time domain) is substituted into S(z) of Formula (13) and then rewritten with respect to the time domain. Edsm(t) is the quantization noise that occurs in delta-sigma modulator 13. When Edsm(t) is z-transformed, it becomes $(1-z^{-1}E(z))$.

With the pulse phase signal RFθpul(t) expressed in Formula (20), the output signal of multi-level class-D amplifier 143A expressed by Formulas (22) and (23) can be expressed as follows.

[Formula 24]

$$VDout2(t) = RF\theta pul(t) \cdot a \cdot \{A(t) + (V_k - V_{k-1})/(Vdsm\max - Vdsm\min) \cdot Edsm(t)\} + b \quad (24)$$

When Formulas (19) and (20) are applied to RFθpul(t) of Formula (24) and a part of Formula (24) is expanded, the following formula can be obtained.

[Formula 25]

$$VDout2(t) = 0.5 \cdot a \cdot \{A(t) \cdot RF\theta(t) + RF\theta(t) \cdot (V_k - V_{k-1})/(Vdsm\max - Vdsm\min) \cdot Edsm(t)\} + (0.5 \cdot Dis(t) + 0.5) \cdot a \cdot \{A(t) + (V_k - V_{k-1})/(Vdsm\max - Vdsm\min) \cdot Edsm(t)\} + b \quad (25)$$

Referring to Formula (15) and Formula (18), "A(t)·RFθ(t)" in the braces of the first term on the right side of Formula (25) is the RF signal RF(t). The quantization noise Edsm(t) has been multiplied by the coefficient $V_k-V_{k-1}$ of the level value detected by level detector 11. "$V_k-V_{k-1}$" is the range of the level value detected by level detector 11. Thus, the narrower this range, the ratio of the quantization noise in VDout2(t) becomes smaller.

After filter element 20 sufficiently suppresses frequency components other than a desired frequency component, the output signal VDout2 of multi-level class-D amplifier 143A is radiated from antenna 21 into the air. Since the second and third terms on the right side of Formula (25) represent components out of the band, they are suppressed by filter element 20.

Thus, according to this exemplary embodiment, although delta-sigma modulator 13 having 1-bit quantizer 133 operates at high speed, delta-sigma modulator 13 can decrease the quantization noise that corresponds to the quantization noise in the case where a delta-sigma modulator having a multi-bit quantizer is employed.

With reference to the exemplary embodiments, the present invention has been described. However, it should be understood by those skilled in the art that the structure and details of the present invention may be changed in various manners without departing from the scope of the present invention.

For example, according to the third exemplary embodiment, the structure using delta-sigma modulator 13 according to the first exemplary embodiment was described. Alternatively, according to the third exemplary embodiment, resettable delta-sigma modulator 13A and level-change detector 15 according to the second exemplary embodiment may be used.

According to the second exemplary embodiment, when the level of the input signal changes, the inner integrating unit is reset such that the delta-sigma modulation is performed regardless of the preceding level of the input signal. Alternatively, when the input signal becomes discontinuous, the inner integrating unit may be reset such that the delta-sigma modulation is performed regardless of the preceding level.

Figure 14:
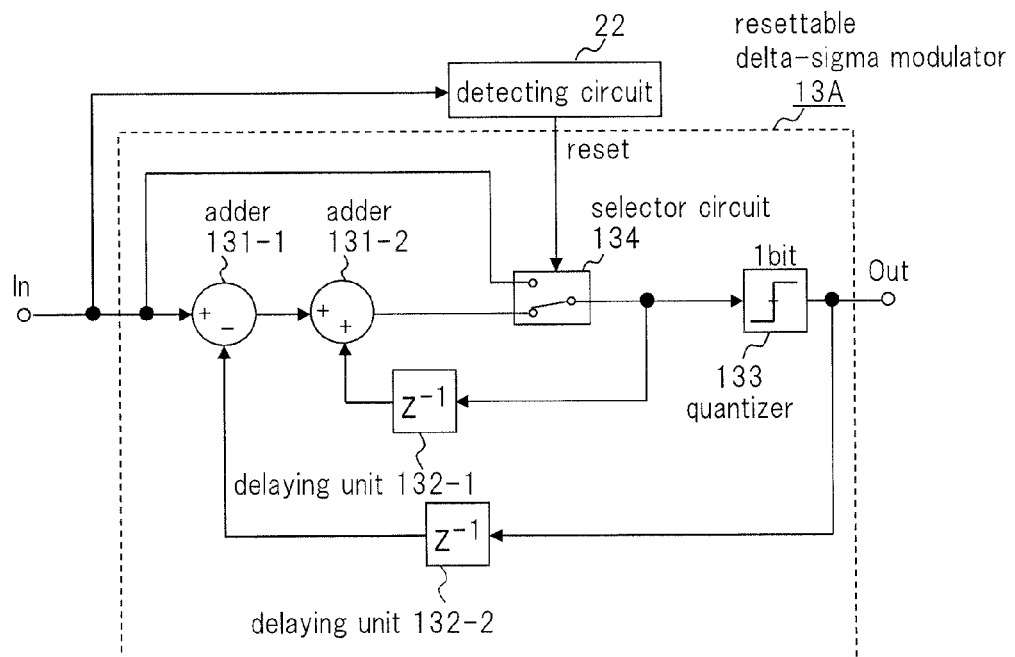
FIG. 14 is a circuit block diagram showing an example of an application of the transmitter according to the second exemplary embodiment of the present invention.

In this case, when detecting circuit 22 detects the discontinuity of the input signal, the inner integrating unit of resettable delta-sigma modulator 13A may be reset. The discontinuity of the input signal may be detected based on, for example, a baseband signal. Although FIG. 14 shows the structure shown in FIG. 8 as resettable delta-sigma modulator 13A, the structure shown in FIG. 10 or FIG. 11 may be used.

The present application claims a priority based on Japanese Patent Application JP 2012-66261 filed on Mar. 22, 2012, the entire content of which is incorporated herein by reference in its entirety.

The invention claimed is:

1. A transmitter, comprising:
    a level detector that detects a level value of an input signal, from among a predetermined number of level values;
    an upstream-side signal adjusting unit that amplifies said input signal and shifts said input signal for an offset amount based on an output signal of said level detector;
    a delta-sigma modulator having a quantizer that quantizes an output signal of said upstream-side signal adjusting unit with a predetermined number of bits, and
    a downstream-side signal adjusting unit that amplifies an output signal of said delta-sigma modulator and shifts the output signal of said delta-sigma modulator for an offset amount based on the output signal of said level detector.

2. The transmitter as set forth in claim 1,
    wherein said downstream-side signal adjusting unit amplifies the output signal of said delta-sigma modulator with an amplification factor that is the reciprocal of the amplification factor of said upstream-side signal adjusting unit and shifts the output signal of said delta-sigma modulator for an offset amount, that is the same as the offset amount of said upstream-side signal adjusting unit, in the reverse direction to that of said upstream-side signal adjusting unit.

3. The transmitter as set forth in claim 1 further comprising:
    a level-change detector that outputs a predetermined signal to said delta-sigma modulator when the output signal of said level detector changes from the output signal that occurred one clock cycle earlier,
    wherein said delta-sigma modulator includes:
    a loop filter that is located on the upstream side of said quantizer and that includes an inner integrating unit; and
    a selector circuit that selects either an output signal of said loop filter or the output signal of said upstream-side signal adjusting unit and outputs the selected signal to said inner integrating unit, and
    wherein said selector circuit selects the output signal of said upstream-side signal adjusting unit and outputs the selected signal to said inner integrating unit when said level-change detector outputs said predetermined signal.

4. The transmitter as set forth in claim 3,
    wherein said selector circuit selects either the output signal of said loop filter or the output signal of said upstream-side signal adjusting unit and outputs the selected signal to said quantizer, and
    wherein said selector circuit selects the output signal of said upstream-side signal adjusting unit and outputs the selected signal to said inner integrating unit and said quantizer when said level-change detector outputs said predetermined signal.

5. The transmitter as set forth in claim 1 further comprising:
    a plurality of switch elements respectively connected to a plurality of power supplies; and
    a decoder that controls opening and closing of said plurality of switch elements based on the output signal of said delta-sigma modulator and the output signal of said level detector.

6. The transmitter as set forth in claim 1, further comprising:
- a multiplying unit that multiplies the output signal of said delta-sigma modulator by a clock signal that drives said delta-sigma modulator.

7. The transmitter as set forth in claim 6, further comprising:
- a plurality of switch elements respectively connected to a plurality of power supplies; and
- a decoder that controls opening and closing of said plurality of switch elements based on the output signal of said multiplying unit and the output signal of said level detector.

8. A transmitting method for a transmitter, comprising:
- detecting a level value of an input signal, from among a predetermined number of level values;
- amplifying said input signal and shifting said input signal for an offset amount based on the detected level value of said input signal as an upstream-side process;
- quantizing a signal, for which said upstream side process has been performed, with a predetermined number of bits, and
- amplifying the signal that has been quantized and shifting the signal that has been quantized for an offset amount based on the level value of said input signal as a downstream-side process.

* * * * *

UNITED STATES PATENT AND TRADEMARK OFFICE
CERTIFICATE OF CORRECTION

| | | |
|---|---|---|
| PATENT NO. | : 9,160,379 B2 | Page 1 of 1 |
| APPLICATION NO. | : 14/380849 | |
| DATED | : October 13, 2015 | |
| INVENTOR(S) | : Shinichi Hori | |

It is certified that error appears in the above-identified patent and that said Letters Patent is hereby corrected as shown below:

Specification

Column 5, Line 15: Delete "$V_{MIN}-V_1$" and insert -- $V_{MIN} \sim V_1$ --

Column 10, Line 52: Delete "*RF*(*t*)=*A*(*t*)cos(ω*t*+θ(*t*)" and insert -- RF(t) = A(t)cos(ωt + θ(t)) --

Signed and Sealed this
Fifth Day of April, 2016

Michelle K. Lee
*Director of the United States Patent and Trademark Office*